(12) United States Patent
Zhang et al.

(10) Patent No.: US 10,242,910 B2
(45) Date of Patent: Mar. 26, 2019

(54) CONTACT STRUCTURE AND ASSOCIATED METHOD FOR FLASH MEMORY

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Chenglong Zhang, Shanghai (CN); Erhu Zheng, Shanghai (CN); Haiyang Zhang, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/624,846

(22) Filed: Jun. 16, 2017

(65) Prior Publication Data
US 2018/0005886 A1 Jan. 4, 2018

(30) Foreign Application Priority Data
Jul. 4, 2016 (CN) .......................... 2016 1 0516625

(51) Int. Cl.
*H01L 21/336* (2006.01)
*H01L 21/768* (2006.01)
(Continued)

(52) U.S. Cl.
CPC .. *H01L 21/76897* (2013.01); *H01L 21/28273* (2013.01); *H01L 21/28282* (2013.01);
(Continued)

(58) Field of Classification Search
CPC ......... H01L 21/76897; H01L 21/28173; H01L 21/28282; H01L 21/31116
See application file for complete search history.

(56) References Cited

U.S. PATENT DOCUMENTS 6,423,627 B1    7/2002    Carter et al.
9,064,801 B1    6/2015    Horak et al.
(Continued)

OTHER PUBLICATIONS

European Patent Application No. 17179520.6, Extended European Search Report dated Nov. 24, 2017, 12 pages.

*Primary Examiner* — Julio J Maldonado
*Assistant Examiner* — Andre C. Stevenson, Sr.
(74) *Attorney, Agent, or Firm* — Kilpatrick Townsend & Stockton LLP

(57) ABSTRACT

A method for manufacturing a semiconductor device includes providing a substrate structure having an action region and a gate structure having a gate dielectric layer, a gate, a hardmask. The method also includes forming a first dielectric layer on the gate structure, forming a second dielectric layer on the first dielectric layer, performing a surface treatment on the second dielectric layer so that the upper surface of the second dielectric layer is flush with the upper surface of the mask member, which has a first recess is in its middle portion, forming a third dielectric layer on the second dielectric layer covering the mask member and selectively etching the third dielectric layer and the second dielectric layer relative to the first dielectric layer and the hardmask to form an opening adjacent to the gate structure and exposing the first dielectric layer on sidewalls of the gate structure.

20 Claims, 15 Drawing Sheets

(51) Int. Cl.
*H01L 21/28* (2006.01)
*H01L 21/311* (2006.01)
*H01L 23/535* (2006.01)
*H01L 29/788* (2006.01)
*H01L 29/792* (2006.01)
*H01L 23/485* (2006.01)
*H01L 29/423* (2006.01)
*H01L 27/11521* (2017.01)
*H01L 27/11568* (2017.01)

(52) U.S. Cl.
CPC .. *H01L 21/31116* (2013.01); *H01L 21/31144* (2013.01); *H01L 21/76805* (2013.01); *H01L 21/76819* (2013.01); *H01L 23/485* (2013.01); *H01L 23/535* (2013.01); *H01L 27/11521* (2013.01); *H01L 29/42324* (2013.01); *H01L 29/788* (2013.01); *H01L 29/792* (2013.01); *H01L 21/76834* (2013.01); *H01L 27/11568* (2013.01); *H01L 29/4234* (2013.01)

(56) References Cited

U.S. PATENT DOCUMENTS

| | | | |
|---|---|---|---|
| 9,337,094 B1 * | 5/2016 | Pranatharthiharan | ........................ H01L 21/76897 |
| 2015/0364326 A1 | 12/2015 | Xie et al. | |
| 2016/0163585 A1 | 6/2016 | Xie et al. | |

* cited by examiner

CONTACT STRUCTURE AND ASSOCIATED METHOD FOR FLASH MEMORY

CROSS-REFERENCES TO RELATED APPLICATIONS

The present application claims priority to Chinese patent application No. 201610516625.2, filed with the State Intellectual Property Office of People's Republic of China on Jul. 4, 2016, the content of which is incorporated herein by reference in its entirety.

FIELD OF THE INVENTION

The present invention relates to semiconductor technology, and more particularly to a semiconductor device having a contact structure and manufacturing method thereof.

BACKGROUND OF THE INVENTION

As technology nodes continue to evolve, the size of contacts becomes smaller. Self-aligned contact (SAC) processes are required for current mainstream technology nodes and for future smaller-sized nodes. In particular, for logic devices and flash memory devices (e.g., NOR flash memory devices), SAC processes are required with the decreasing size in technology nodes.

FIG. 1A is a cross-sectional view of a contact hole etched in a conventional flash memory device. The flash memory device may include a semiconductor substrate 100 and a gate structure on semiconductor substrate 100. The gate structure may include a gate insulating layer 101, a charge storage layer 103 on gate insulating layer 101, an interlayer dielectric (also referred to as inter-gate dielectric) layer 105 on charge storage layer 103, a gate 107 on interlayer dielectric layer 105, and a hardmask 109 on gate 107. Flash memory device 10 may further include spacers 111 on opposite sides of gate 107 and optionally a mask layer 113 on the gate structure and the substrate. FIG. 1B is an ideal case of etching a contact hole for a contact to an active region in the flash memory device. As shown in FIG. 1A, an interlayer dielectric layer 115 is formed on mask layer 113, or, in other cases, on the gate structure and the substrate. Thereafter, an SAC etching of the contact hole is performed using a patterned mask layer 117 (e.g., photoresist) formed on interlayer dielectric layer 115 extending to the active region (a portion of substrate 100) to form a contact hole 119.

The etch selectivity of the etch process to etch the contact hole is characterized by the ratio of an etch rate of the interlayer dielectric layer (e.g., silicon oxide) relative to the etch rate of the hardmask on the gate (as well as additional sidewalls or sidewall spacers, if any) (e.g., silicon nitride). Ideally, as shown in FIG. 1B, the etch selectivity of the etch process to etch the contact hole is so selected that hardmask 109 remains on gate 107 and spacers 111 remain on sidewalls of gate 107, thereby protecting gate 107.

However, as the size of technology nodes shrinks, the change of the etch selectivity becomes an important consideration for etching. FIGS. 1C and 1D illustrate an example of problems in the flash memory device of FIG. 1A in current SAC processes, particularly, in SAC processes in flash memory devices.

When the etch selectivity of the etch process to etch the contact hole is insufficient, hardmask 109 will be excessively etched and sidewall spacers 111 and/or mask layer 113 will also be consumed, thereby exposing gate 107 causing a short circuit between the gate and the contact in the contact hole, as indicated by the dotted circle in FIG. 1C.

On the other hand, when the etch selectivity of the etch process to etch the contact hole is too high, a portion of interlayer dielectric layer 115 and mask layer 113 (if any) may remain in the contact hole to be formed with resulting risk an open circuit, as shown in FIG. 1D.

For some semiconductor devices, such as flash memory devices (e.g., NOR flash memory devices), due to their high aspect ratio and/or the vias and trenches formed in a single contact hole etch, the above-described problems will become more severe. For logic devices, the problems are similar when SAC processes are used.

Thus, a novel semiconductor device structure and manufacturing method thereof are needed to solve the above-described problems.

BRIEF SUMMARY OF THE INVENTION

Embodiments of the present invention provide a method for manufacturing a semiconductor device. The method may include providing a substrate structure including a semiconductor substrate having an active region, at least one gate structure on the active region and including a gate dielectric layer on the active region, a gate portion on the gate dielectric layer, and a hardmask on the gate; forming a first dielectric layer on the at least one gate structure and a surface of the active region adjacent to the at least one gate structure, wherein a portion of the first dielectric layer on the hardmask and the hardmask form a mask member; forming a second dielectric layer on the first dielectric layer covering the at least one gate structure; performing a surface treatment on the second dielectric layer so that an upper surface of the second dielectric layer is flush with an upper surface of the mask member and a first recess is formed in a middle portion of the upper surface of the mask member; forming a third dielectric layer on the second dielectric layer covering the mask member; and selectively etching the third dielectric layer and the second dielectric layer relative to the first dielectric layer and the mask member to form an opening adjacent to the at least one gate structure, the opening exposing a portion of the first dielectric layer on sidewalls of the at least one gate structure and a portion of the first dielectric layer on the active region adjacent to the at least one gate structure.

In one embodiment, the selectively etching further etches an upper portion of the mask member and a portion of the first dielectric layer on the sidewalls of the mask member adjacent to the opening to form a second recess.

In one embodiment, the selectively etching causes a portion of the upper surface of the mask member away from the opening to be higher than a remaining portion of the mask member, and a portion of the upper surface of the mask member in a vicinity of the opening to be lower than a bottom of the first recess of the mask member.

In one embodiment, the mask member is configured such that, after performing the surface treatment, a ratio of a thickness of a portion at the bottom of the first recess in the mask member to a thickness of the second dielectric layer at the same level of the first recess bottom is greater than an etch selectivity ratio of a material of the mask member to a material of the second dielectric layer.

In one embodiment, the at least one gate structure includes two adjacent gate structures, the first dielectric layer being formed to cover the two adjacent gate structures and a surface of the active region between the two adjacent gate structures. Forming the second dielectric layer includes filling an air gap between the two adjacent gate structures. The opening is disposed between the two adjacent gate structures exposing a portion of the first dielectric layer on the active region between the two adjacent gate structures.

In one embodiment, providing the substrate structure includes forming the gate dielectric layer on the semiconductor substrate, forming a charge storage layer on the gate dielectric layer, forming an intermediate dielectric layer on the charge storage layer, forming a first gate layer on the intermediate dielectric layer, forming a hardmask layer on the first gate layer, and etching the hardmask layer, the first gate layer, the intermediate dielectric layer, the charge storage layer, and the gate dielectric layer to form the at least one gate structure. The gate portion includes a charge storage portion on the gate dielectric layer, the intermediate dielectric layer on the charge storage portion, and the first gate layer on the intermediate dielectric layer.

In one embodiment, providing the substrate structure includes forming the gate dielectric layer on the semiconductor substrate, forming a second gate layer on the gate dielectric layer, forming a hardmask layer on the second gate layer, etching the hardmask layer, the second gate layer, and the gate dielectric layer to form the at least one gate structure. The gate portion includes the second gate layer on the gate dielectric layer.

In one embodiment, performing the surface treatment includes planarizing the second dielectric layer to expose the upper surface of the mask member, and etching back the exposed upper surface to form the first recess.

In one embodiment, performing the surface treatment includes performing an over polish on the second dielectric layer using a chemical mechanical polishing process.

In one embodiment, selectively etching the third dielectric layer and the second dielectric layer includes performing a dry or wet scanning, a nanoprinting, or self-assembly process using a patterned mask.

In one embodiment, selectively etching the third dielectric layer and the second dielectric layer includes performing a dry plasma etching based on a fluorocarbon (CxFy), x and y being positive number, wherein the etch ratio of the third and second dielectric layers to the hardmask and/or the first dielectric layer is greater than 1 and less than or equal to 10.

In one embodiment, the method may further include removing a portion of the exposed first dielectric layer on a portion of the active region to expose a surface of the active region; and forming a contact member extending to the exposed surface of the active region.

In one embodiment, the first dielectric layer and the hardmask include a same material.

In one embodiment, the semiconductor device includes a flash memory cell including the at least one gate structure. In one embodiment, the active region is a fin-shaped active region.

In one embodiment, the charge storage portion is a floating gate or a silicon oxide-silicon nitride-silicon oxide stacked structure.

Embodiments of the present invention also provide a semiconductor device. The semiconductor device may include a substrate structure. The substrate structure includes a semiconductor substrate including an active region; at least one gate structure on the active region and comprising a gate dielectric layer on the active region, a gate portion on the gate dielectric layer, and a mask member on the gate portion; and a first dielectric layer on sidewalls of the at the at least one gate structure The substrate structure also includes an opening adjacent to the at least one gate structure and exposing the first dielectric layer on sidewalls of the at least one gate structure and a surface portion of the active region adjacent to the at least one gate structure. The mask member includes a first recess in a meddle portion of its upper surface.

In one embodiment, the semiconductor device further includes a second recess formed on a portion of the upper portion of the mask member adjacent to the opening and a portion of an upper portion of the first dielectric layer on the sidewalls of the mask member adjacent to the opening.

In one embodiment, a portion of the upper surface of the mask member away from the opening is higher than a remaining portion of the upper surface of the mask member, and a portion of an upper surface of the mask member in a vicinity of the opening is lower than a bottom in the middle portion of the first recess.

In one embodiment, the mask member is configured such that a ratio of a thickness of a portion of the upper surface of the mask member at the bottom of the first recess to a thickness of a portion of the second dielectric layer at a same level of the upper surface of the mask member is greater than an etch selectivity ratio of a material of the mask member to a material of the second dielectric layer.

In one embodiment, the at least one gate structure comprises two adjacent gate structures, and the opening exposes a surface of the first dielectric layer disposed between the two adjacent gate structures and a surface of the active region disposed between the two adjacent gate structures.

In one embodiment, the semiconductor device further includes a contact member filling the opening and extending to the exposed surface portion of the active region.

In one embodiment, the semiconductor device may further include a flash memory cell having the at least one gate structure.

In one embodiment, the active region is a fin-shaped active region.

In one embodiment, the gate portion includes a charge storage portion on the gate dielectric layer, an intermediate dielectric layer on the charge storage portion, and the first gate layer on the intermediate dielectric layer.

In one embodiment, the charge storage portion is a floating gate or a silicon oxide-silicon nitride-silicon oxide stacked structure.

In one embodiment, the gate portion includes a second gate layer on the gate dielectric layer.

Some embodiments of the present invention also provide a method for manufacturing a semiconductor device. The method may include providing a substrate structure including an active region and a first interlayer dielectric layer on the active region, the first interlayer dielectric layer including at least one opening extending to the active region, the substrate structure further including spacers on sidewalls of the at least one opening and a gate dielectric layer in the at least one opening and on the active region; forming a metal gate material layer on the substrate structure to fill the at least one opening; and etching back the metal gate material layer to form a metal gate in the at least one opening and on the gate dielectric layer. The method also may include, after forming the metal gate, forming a hardmask material layer to fill the at least one opening; processing the hardmask material layer to form a hardmask on the metal gate, the hardmask having an upper surface including a first recess in a middle portion of the hardmask, so that at least one gate structure including the gate dielectric layer, the metal gate, the hardmask and the spacers is formed in the at least one opening; forming a second interlayer dielectric layer on the substrate structure including the hardmask; and selectively etching the second interlayer dielectric layer and the first interlayer dielectric layer with respect to the spacers and the hardmask to form a second opening adjacent to the at least one opening, the second opening exposing the spacers of the at least one gate structure and a surface of the active region adjacent to the at least one gate structure.

In one embodiment, selectively etching the second interlayer dielectric layer and the first interlayer dielectric layer causes the removal of a portion of an upper portion of the hardmask of the at least one gate structure adjacent to the second opening and a portion of an upper portion of the spacers on the sidewalls of the hardmask to form a second recess.

In one embodiment, selectively etching the second interlayer dielectric layer and the first interlayer dielectric layer causes a portion of the upper surface of the hardmask of the at least one gate structure away from the second opening to be higher than a remaining surface portion of the hardmask in a vicinity of the second opening, and a portion of the upper surface of the hardmask of the at least one gate structure in the vicinity of the second opening to be lower than a bottom in the middle portion of the first recess of the hardmask.

In one embodiment, after processing the hardmask material layer, the mask member is configured such that a ratio of a thickness of a portion of the bottom of the first recess in the mask member to a thickness of a portion of the second dielectric layer at a same level of the bottom of the mask member is greater than an etch selectivity ratio of a material of the mask member to a material of the second dielectric layer.

In one embodiment, the at least one gate structure includes two adjacent gate structures, and the second opening is disposed between the two adjacent gate structures and exposing spacers of the two adjacent gate structures adjacent to the second opening, and a surface of the active region disposed between the two adjacent gate structures.

In one embodiment, processing the hardmask material layer includes performing an over polish on the hardmask material layer using a chemical mechanical polishing process.

In one embodiment, processing the hardmask material layer includes performing a chemical mechanical polishing process on the hardmask material layer to form the hardmask on the metal gate; and etching back the upper surface of the hardmask to form the first recess.

In one embodiment, selectively etching the second interlayer dielectric layer and the first interlayer dielectric layer comprises performing a dry plasma etching based on a fluorocarbon gas (CxFy, where x and y are positive numbers), wherein the etch ratio of the third and second dielectric layers to the hardmask and/or the first dielectric layer is greater than 1 and less than or equal to 10.

In one embodiment, the method further includes forming a contact member extending to the exposed surface portion of the active region.

In one embodiment, the spacers and the hardmask are made of a same material.

In one embodiment, the active region is a fin-shaped active region.

Some embodiments of the present invention also provide a semiconductor device. The semiconductor device may include a substrate structure comprising an active region, a first interlayer dielectric layer on the active region, and a first opening in the first interlayer dielectric layer and extending to the active region; at least one gate structure in the first opening and comprising spacers on sidewalls of the first opening, a gate dielectric layer on the active region, a metal gate on the gate dielectric layer, and a hardmask on the metal gate and having a first recess in a middle portion of its upper surface, the gate dielectric layer, the metal gate, and the hardmask being between the spacers; and a second opening adjacent to the at least one gate structure in the first opening and exposing the spacers and a surface of the active region.

In one embodiment, the semiconductor device also includes a second recess formed on a portion of an upper portion of the mask member adjacent to the second opening and a portion of an upper portion of the spacers on the sidewalls of the mask member adjacent to the opening.

In one embodiment, a portion of an upper surface of the mask member away from the first opening is higher than a remaining portion of the upper surface of the mask member, and a portion of an upper surface of the mask member in a vicinity of the first opening is lower than a bottom in the middle portion of the first recess.

In one embodiment, the mask member is configured such that a ratio of a thickness of a portion at the bottom of the first recess in the mask member to a thickness of a portion of the second dielectric layer at a same level of the bottom of the mask member is greater than an etch selectivity ratio of a material of the mask member to a material of the second dielectric layer.

In one embodiment, the first opening includes two adjacent openings, the at least one gate structure includes two adjacent gate structures each disposed in one of the two adjacent openings, and the second opening exposes spacers between the two adjacent gate structures and a surface of the active region disposed between the two adjacent gate structures.

In one embodiment, the semiconductor device may further include a contact member filling the first and second openings and extending to the exposed surface of the active region.

In one embodiment, the spacers and the hardmask include a same material. In one embodiment, the active region is a fin-shaped active region.

The following detailed description together with the accompanying drawings will provide a better understanding of the nature and advantages of the present invention.

BRIEF DESCRIPTION OF THE DRAWINGS

Embodiments of the present invention are described with reference to the accompanying drawings. In the drawings, like reference numbers may indicate identical or functionally similar elements.

DETAILED DESCRIPTION OF THE INVENTION

Figure 1A:
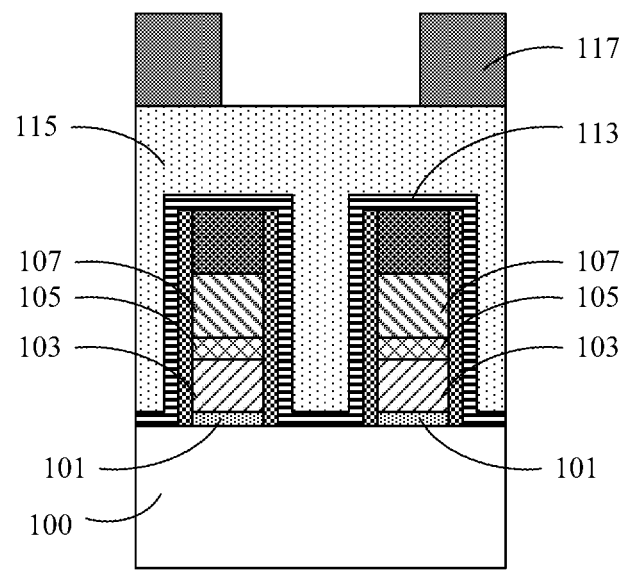
FIG. 1A is a cross-sectional view illustrating of a to-be-etched contact hole of a flash memory device.
Figure 1B:
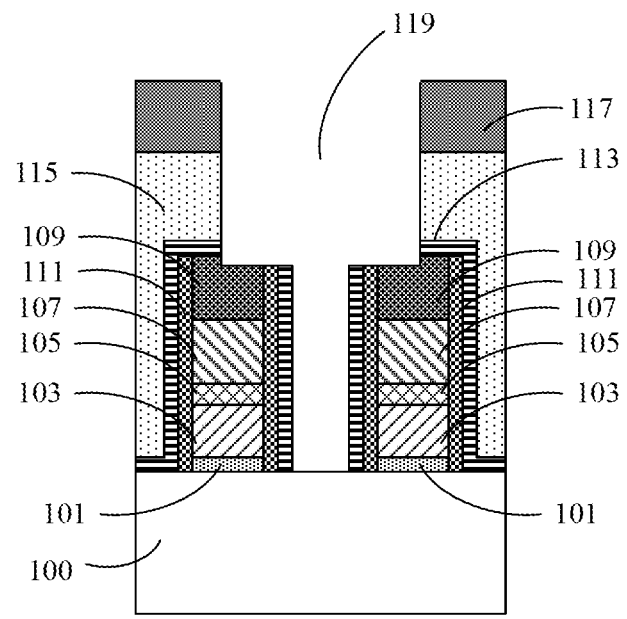
FIG. 1B is a cross-sectional view illustrating an etched contact hole of a flash memory device in an ideal case.
Figure 1C:
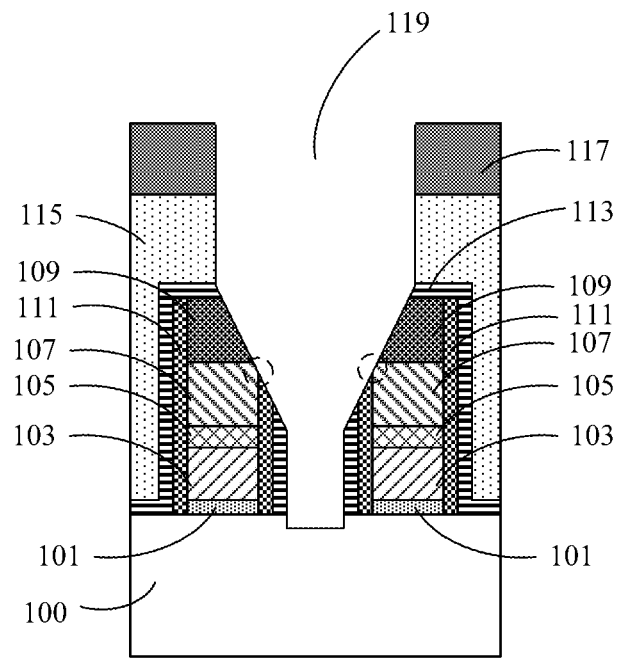
FIGS. 1C and 1D are cross-sectional views exemplarily illustrating problems in a conventional self-aligned contact (SAC) process (particular in an SAC process for flash memory devices).
Figure 1D:
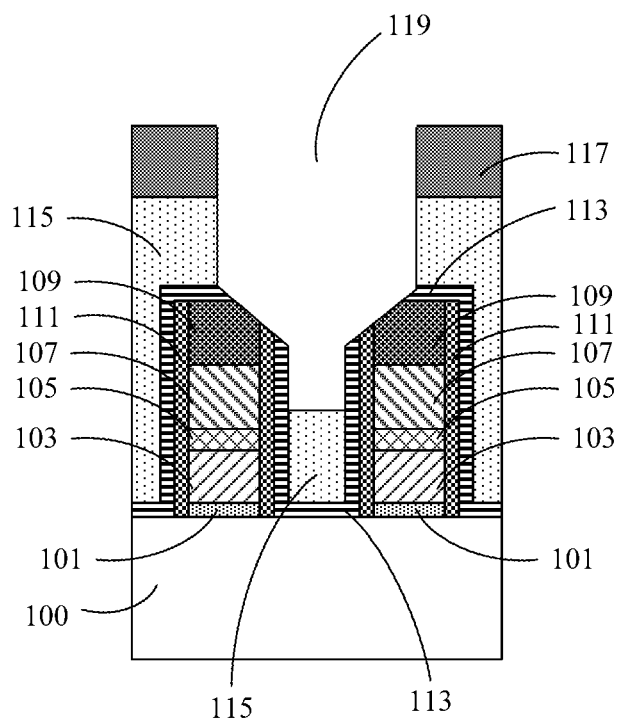

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The embodiments described and references in the disclosure to "one embodiment," "an embodiment," "an exemplary embodiment" indicate that the embodiments described may include a particular feature, structure, or characteristic. However, every embodiment may not necessary include the particular feature, structure or characteristic. As used throughout this disclosure, the terms "depositing" and "forming" are used interchangeably.

Embodiments of the present invention now will be described more fully hereinafter with reference to the accompanying drawings, in which embodiments of the invention are shown. This invention may, however, be embodied in many different forms and should not be construed as limited to the embodiments set forth herein.

Figure 2:
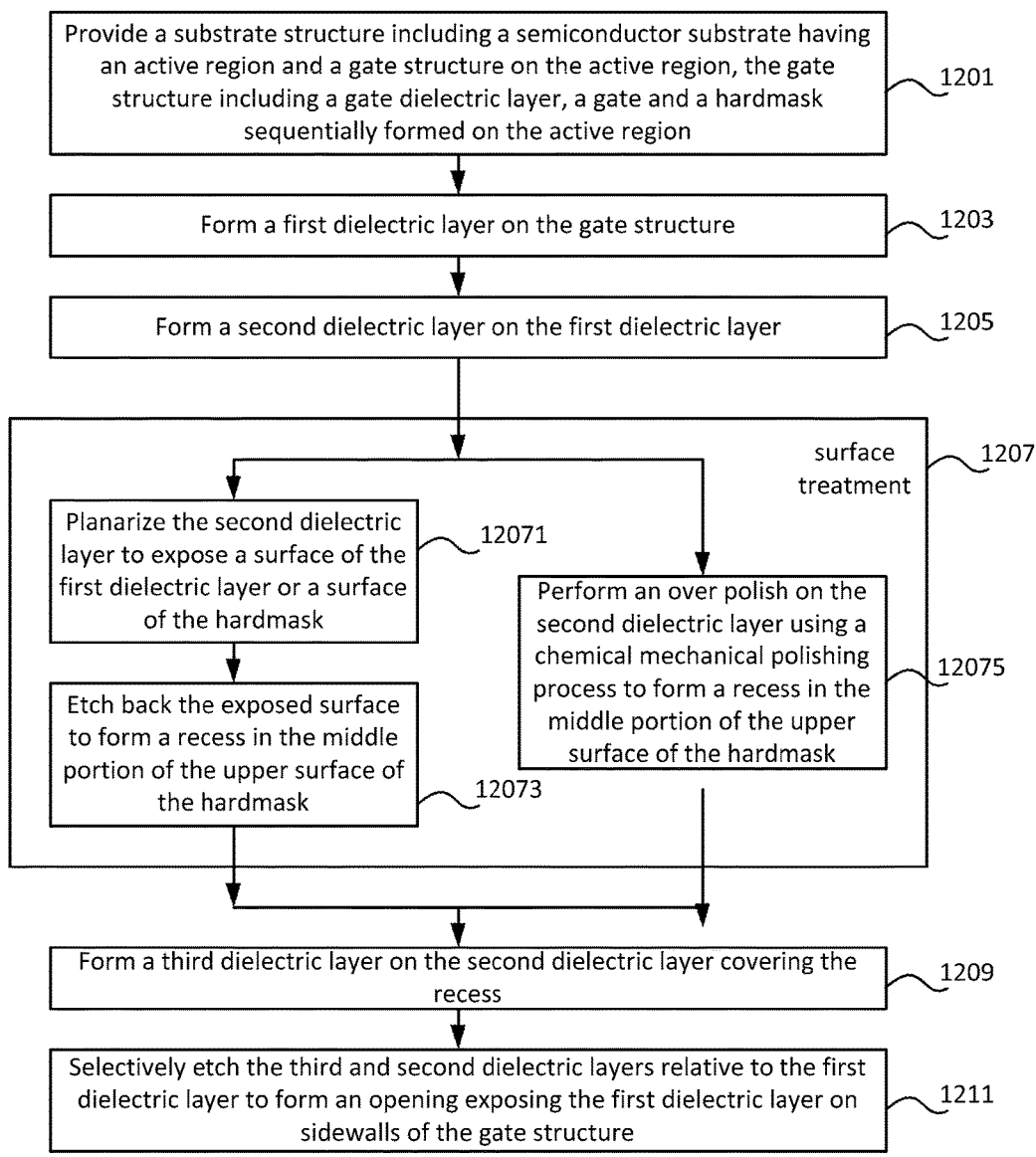
FIG. 2 is a simplified flowchart illustrating some of the main steps in a method for manufacturing a semiconductor device according to one embodiment of the present invention.

FIG. 2 is a simplified flowchart of a method for manufacturing a semiconductor device according to one embodiment of the present invention. FIGS. 3 through 11 are cross-sectional views illustrating intermediate stages of a semiconductor device in some of the main steps in a manufacturing method according to one embodiment of the present invention.

Referring to FIG. 2, the method may include the following process steps:

At 1201: providing a substrate structure. The substrate structure may include a semiconductor substrate having an active region, a plurality of gate structures on the active region and separated from each other. The gate structures each may include a gate dielectric layer on the active region and a gate on the gate dielectric layer. The gate structures each may also include a hardmask layer on the gate.

Figure 3:
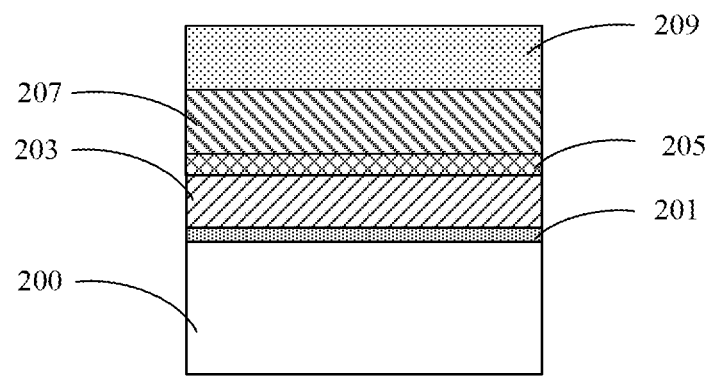
FIGS. 3 through 11 are cross-sectional views illustrating intermediate stages of a semiconductor device in some of the main steps in a manufacturing method according to one embodiment of the present invention.
Figure 4A:
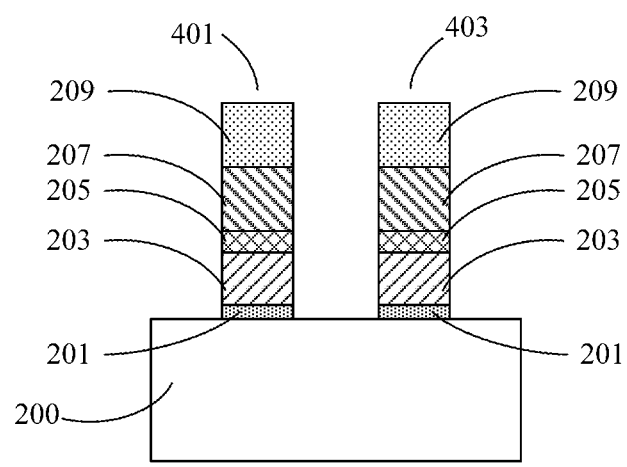

FIG. 3 and FIG. 4A are cross-sectional views of an exemplary substrate structure. Referring to FIG. 3, a gate dielectric layer 201 is formed on a semiconductor substrate 200 having an active region. A charge storage layer 203 is formed on gate dielectric layer 201. An intermediate dielectric layer 205 is formed on charge storage layer 203. A first gate layer 207 is formed on intermediate dielectric layer 205. A hardmask layer 209 is formed on first gate layer 207.

Herein, it is understood by those of skill in the art that these layers may be formed using processes known in the art or developed in the future, and the processes of forming these layers will not be described in detail for sake of brevity. Further, it is understood that semiconductor substrate 200 is not limited to a particular type of a semiconductor layer as long as the semiconductor layer includes an active region. For example, the semiconductor substrate may be a bulk semiconductor substrate, an SOI (semiconductor on insulator) substrate, or the like. In other words, reference numeral 200 may also be used to indicate an active region including a semiconductor substrate.

Next, an etching process is performed on the layers to form gate structures 401 and 403, as shown in FIG. 4. Thus, a semiconductor structure is provided that includes a semiconductor substrate 200 having an active region and gate structures 401 and 403 on the active region. Each of gate structures 401 and 403 includes a gate dielectric layer 201 on the active region and a gate portion on gate dielectric layer 201. The gate portion includes a charge storage portion 203 on gate dielectric layer 201, an intermediate dielectric layer 205 on charge storage portion 203, and a first gate layer 207 on intermediate dielectric layer 205. The gate structures each may also include a hardmask 209 on the gate portion (specifically on first gate layer 207).

In some embodiments, charge storage portion 203 may be a floating gate, for example, it may be formed of polysilicon. In other embodiments, charge storage portion 203 may be made of other material as long as it is capable of storing electrical charge. For example, charge storage portion 203 may be may be a stack of silicon oxide/silicon nitride/silicon oxide (ONO).

In some embodiments, intermediate dielectric layer 205 may be formed of any suitable dielectric layer, e.g., silicon oxide, silicon nitride, or a stack of silicon oxide and silicon nitride. For example, in the case where charge storage portion 203 is a floating gate, intermediate dielectric layer 205 may be formed of a stack of silicon oxide/silicon nitride/silicon oxide (ONO).

In some embodiments, first gate layer 207 may be made of doped polysilicon. In other embodiments, first gate layer 207 may also be made of a metal or other conductive materials In some embodiments, hardmask 209 may be made of one or more of silicon oxide, silicon nitride, and metal oxide.

Further, as those of skill in the art will appreciate, the semiconductor device according to the present invention may include a flash memory cell including one of the gate structures.

Figure 4B:
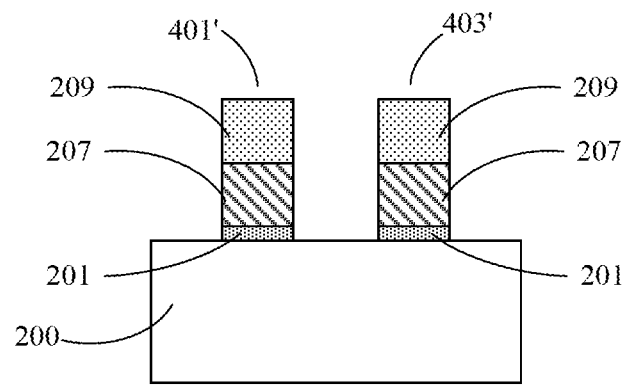

Similarly, FIG. 4B is a cross-sectional view of a substrate structure according to another embodiment of the present invention. The substrate structure in FIG. 4B may include a semiconductor substrate 200 having an active region, and gate structures 401' and 403' on the active region. Each of gate structures 401' and 403' includes a gate dielectric layer 201 on the active region and a gate portion including a gate layer 207 on gate dielectric layer 201. Each of gate structures 401' and 403' also includes a hardmask 209 on the gate portion (specifically on second gate layer 207). Similarly, the gate structures may be formed by forming a gate dielectric layer on the semiconductor substrate, forming a gate layer on the gate dielectric layer, forming a hardmask layer on the second gate layer, and etching the hardmask layer, the second gate layer, the gate dielectric layer to form the gate structures. The following process steps will be described based on FIG. 4A with reference to FIGS. 5 through 11. However, the description may also be applied to the substrate structure in FIG. 4B.

It is understood that the number of gate structures can be any integer number N. In the example shown in the drawings, two adjacent and separate gate structures 401 and 403 are used on the semiconductor substrate. But it is understood that the number is arbitrary chosen for describing the example embodiment and should not be limiting.

Figure 5:
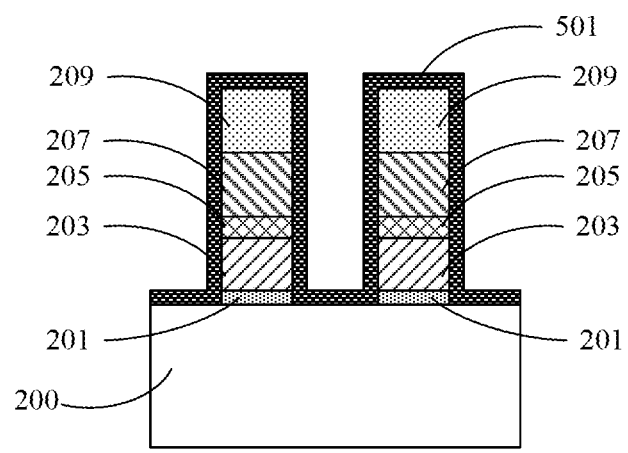

At 1203: a first dielectric layer is formed on the substrate structure. Referring to FIG. 5, a first dielectric layer 501 is formed on the substrate structure covering the gate structures and the surface portion of the active area adjacent to the gate structures. In some embodiments, first dielectric layer 501 may include a same material as that of hardmask 209, such as silicon nitride. In other embodiments, first dielectric layer 501 may include a material that is different from that of hardmask 209 as long as it has an etch selectivity higher than the etch selectivity of a second dielectric layer 601 that is formed later thereon (see FIG. 6). In other words, the etch rate of the etchant used for the first insulating layer is greater than that of the etchant used for the second insulating layer. In a preferred embodiment, first dielectric layer 501 may be formed of silicon nitride using a flowable chemical vapor deposition (FCVD).

It will be appreciated that, in the case of two adjacent and separate gate structures 401 and 403, first dielectric layer 501 may be formed to cover gate structures 401 and 403 and the surface portion of the active region between the adjacent separate gate structures 401 and 403.

Figure 6:
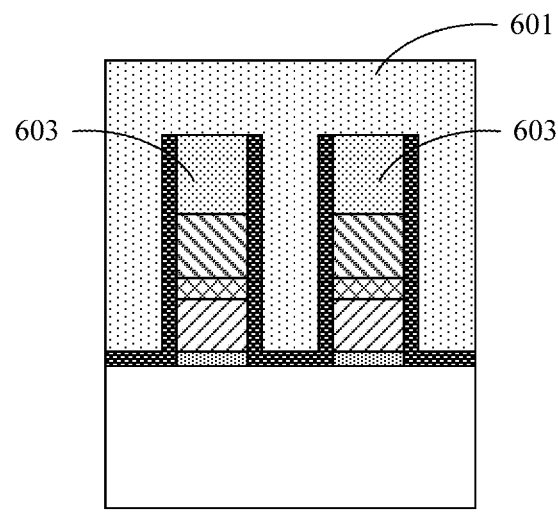

Herein, hardmask 209 on the gate portions and first dielectric layer 501 on hardmask 209 may be collectively referred to as a mask member 603, as shown in FIG. 6.

At 1205: a second dielectric layer is formed on the first dielectric layer. Referring to FIG. 6, a second dielectric layer 601 is formed on first dielectric layer 501 covering the gate structures. In other words, second dielectric layer 601 has a thickness that is greater than the height of the gate structures. Second dielectric layer 601 may include silicon oxide. For the sake of clarity, reference numerals that have been provided to elements in previous drawings will be omitted and further description will not be repeated hereinafter. In some embodiments, second dielectric layer 601 may fill the air gap between adjacent gate structures 401 and 403.

As described above, hardmask 209 and first dielectric layer 501 disposed thereon are collectively referred to as mask member 603, which is filled with the same pattern as hardmask 209 in FIGS. 6 through 12.

At 1207: a recess treatment (alternatively referred to as surface treatment) is performed on the second dielectric layer. The recess treatment (i.e., surface treatment) is used to remove an upper portion of the second dielectric layer or an upper portion of the second dielectric layer and an upper portion of the mask portion. Thus, after the recess treatment (surface treatment), the upper surface of the remaining second dielectric layer is flush with the upper surface of the remaining mask portion, and the middle portion of the upper surface of the remaining mask portion has a first recess. As used herein, the term "flush" means substantially planar within variations in manufacturing tolerances.

Figure 7:
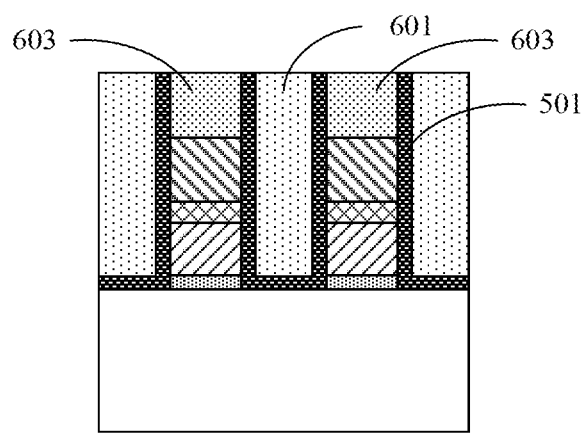

In one embodiment, the surface treatment may include 12071: after forming second dielectric layer 601, performing a planarization of second dielectric layer 601 to expose the upper surface of mask member 603 (e.g., an upper surface of first dielectric layer 501 or an upper surface of hardmask layer 209 of the gate structures), as shown in FIG. 7. It is understood, as described above, the etch selectivity of first dielectric layer 501 and hardmask 209 may be considered as a common constituent element (as indicated by reference numeral 603) relative to the etch selectivity of second dielectric layer 601. Thus, by way of example, the formed first recess may be configured, such that, for example, only in first dielectric layer 501, only in hardmask 209 (in which case first dielectric layer 501 is removed), or in first dielectric layer 501 and extending onto hardmask 209. In some embodiments, first dielectric layer 501 and hardmask 209 may be formed of the same material, as described above, so that first dielectric layer 501 and hardmask 209 may be considered together as a common element.

In other words, the planarization causes the upper surface of the planarized mask portion to be exposed, and the planarization may or may not cause an upper portion of the mask portion to be removed.

Figure 8:
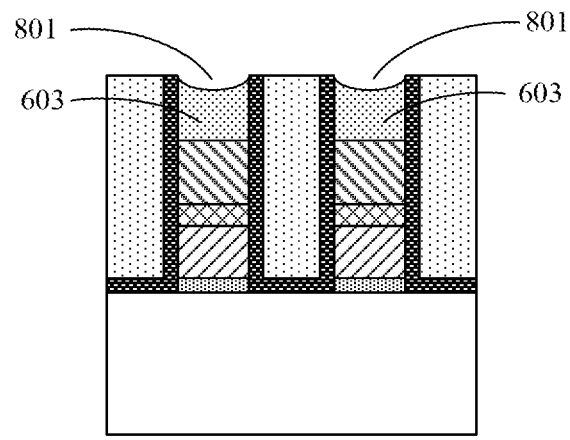

The surface treatment may also include 12073: the exposed upper portion of the mask portion is etched back to form a first recess 801 in the upper surface of the mask member whose middle portion is depressed, as shown in FIG. 8. In an exemplary embodiment, the first dielectric layer may be formed using a plasma etching process including a fluorine-containing process gas, including, but is not limited to, one or more of $CHF_3$, $CH_2F_2$, $CH_3F$, then performing a surface treatment on the upper surface of the first dielectric layer or on an upper surface of the hardmask of the gate structures to form the first recess.

In another embodiment, the surface treatment may include 12075: after forming second dielectric layer 601 on the first dielectric layer, performing an over polish using a chemical mechanical polishing process on second dielectric layer 601, so that after the surface treatment, the upper surface of the remaining second dielectric layer 601 is flush with the upper surface of the remaining mask member 603, and the middle portion of the upper surface of the mask member has a first recess.

In other words, in the mask member, the portion of its upper surface adjacent to the to-be-formed opening (1003 in FIG. 10) has a thickness that is greater than the thickness of the middle portion. Further, it is understood that the first recess shown in FIG. 8 is merely exemplary, and the scope of the invention is not limited to example embodiments shown in the figures.

Figure 9:
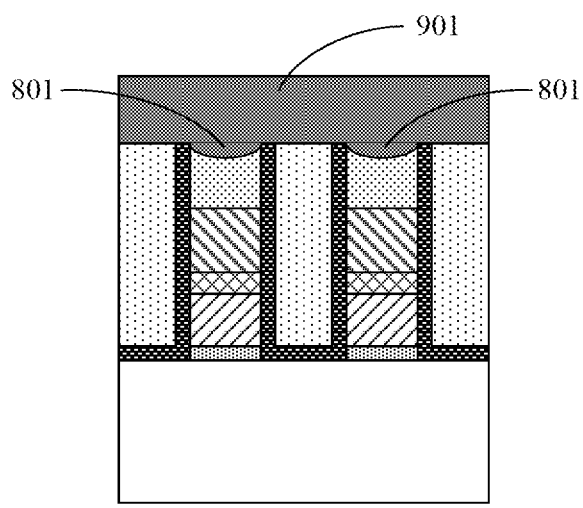

At 1209: a third dielectric layer is formed covering an upper surface of the remaining second dielectric layer and an upper surface of the remaining mask member. Referring to FIG. 9, a third dielectric layer 901 is formed covering an upper surface of the remaining second dielectric layer and an upper surface of the remaining mask member. The material and the process for forming third dielectric layer 901 is are not particularly limited. For example, in some embodiments, third dielectric layer 901 may be formed of a spin-coated dielectric layer using a spin coating process. In other embodiments, third dielectric layer 901 may be formed of silicon oxide using a conventional chemical vapor deposition (CVD) process.

Figure 10:
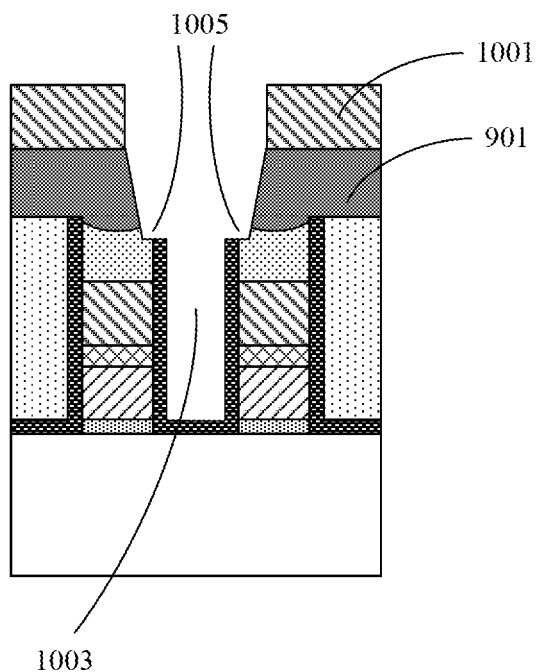

At 1211: third dielectric layer 901 and second dielectric layer 601 are selectively etched relative to first dielectric layer 501, preferably, to the first dielectric layer and the remaining hardmask portion (corresponding to the first dielectric layer and selectively the remaining hardmask member) to form an opening adjacent to the gate structures, as shown in FIG. 10. The opening exposes the first dielectric layer on sidewalls of the adjacent gate structures on the active region.

In the embodiment including two adjacent gate structures, the opening may include an opening 1003 between and adjacent to the two gate structures. Opening 1003 exposes a portion of first dielectric layer 501 on sidewalls between the two gate structures and a portion of first dielectric layer 501 on the active region between the two gate structures.

In some embodiments, an etching process may be performed using a patterned mask (e.g., photoresist) 1001. For example, a functional layer for lithography such as, but not limited to, a bottom anti-reflective coating (BARC), amorphous carbon (AC), and/or dielectric anti-reflective coating (DARC). Thereafter, a photoresist is formed on the functional layer and patterned (exposed and developed). For example, patterned mask 1001 may be formed using a dry or wet scanning, nanoprinting, or self-assembly process. In some embodiments, the feature size (e.g., lateral dimension) in the patterned mask to form the opening (e.g., opening in the patterned mask) is greater than a feature size of the corresponding opening. After etching the third and second dielectric layers, the photoresist and the functional layer can be removed.

Herein, a dry plasma etching based on a fluorocarbon gas (CxFy, where x and y are positive numbers) may be used and is configured such, that the etch ratio of the third and second dielectric layers to the hardmask and/or the first dielectric layer is greater than 1, preferably greater than 1 and less than or equal to 10, more preferably between 3 and 10, and more preferably between 5 and 10.

In some embodiments, referring to FIG. 10, the etching process may cause the portion of the upper surface of mask portion 603 away from the opening to be higher than the remaining portion, and the portion of the upper surface of the member portion 603 in the vicinity of the opening to be lower than the bottom of the first recess in the middle portion of the mask member.

In some embodiments, the etching process may also cause the removal of an upper portion of the remaining mask portion 603 adjacent to the opening and a portion of first dielectric layer 501 on the sidewalls of the remaining mask portion 603, thereby forming a second recess 1005, as shown in FIG. 10. In other words, a second recess is formed on an upper portion of the mask member adjacent to the opening and a portion of the first dielectric layer on sidewalls of the mask member adjacent to the opening.

In one embodiment, after the surface treatment, the ratio of the thickness of the portion at the bottom of the first recess in the mask member to the thickness of the second dielectric layer at the same level of the bottom of the first recess in the mask member is greater than the etch selectivity ratio of the material of the mask member to the material of the second dielectric layer. It should be understood by those skilled in the art that the above configuration is not essential to the described embodiments of the present invention, other embodiments may not require such configuration depending on the material employed, the size of the opening, the thickness of each material layer.

Figure 11:
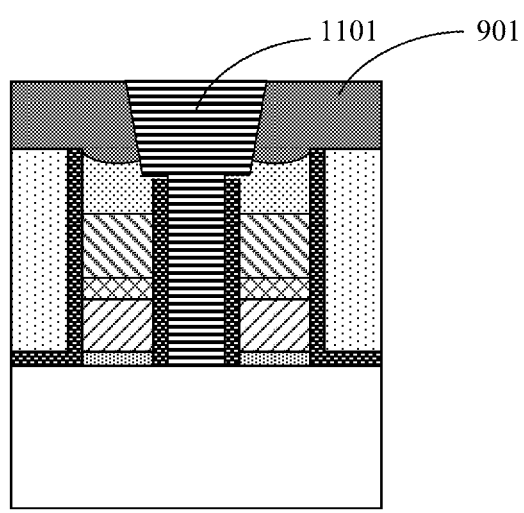

Next, referring to FIG. 11, a portion of the exposed first dielectric layer 501 on the active region is removed to expose a surface of the active region. A contact 1101 is then formed on the exposed surface of the active region. In one embodiment, the portion of the first dielectric layer on the active region may be removed using a conventional spacer forming process. In some embodiments, a dry plasma etching based on a fluorocarbon gas (CxFy, where x and y are positive numbers) may be used and is configured such, that the etch ratio of the third and second dielectric layers to the hardmask and/or the first dielectric layer is greater than 1, preferably greater than 1 and less than or equal to 10, more preferably between 3 and 10, and more preferably between 5 and 10. Contact 1101 may be formed using any materials and processes known in the art or developed in the future, so that a detail description thereof will be omitted.

In some embodiments, the active region may be in the form of a bulk semiconductor, e.g., the active region may be formed from a bulk semiconductor substrate or a silicon-on-insulator (SOI) substrate. In other embodiments, the active region may be a fin-shaped active region. For example, FIGS. 4A to 11 may be cross-sectional views taken along the longitudinal direction of the semiconductor fin.

According to embodiments of the present invention, after forming a contact hole to the active region, hardmask 209 and first dielectric layer 501 remain almost unchanged in shape (or has at least a better profile shape) to cover first gate 207.

According to embodiments of the present invention, it is possible to reduce or even eliminate the problems of the prior art, by preventing damage caused to the gate structures, and short circuits from being formed between the contact and the active region. The profile of the device structure is also improved, thereby improving reliability and yield of the device.

It is to be understood that the figures of the exemplary embodiments show two adjacent and separated gate structures and the first dielectric layer formed on the two gate structures and on the surface of the active area between the two gate structures. Accordingly, the second dielectric layer is formed filling an air gap between the two gate structures. Accordingly, the opening is disposed between the two gate structures and adjacent to the two gate structures and exposes a portion of the first dielectric layer between the two gate structures and a portion of the first dielectric layer on the active region between the two gate structures. But the invention is not limited thereto, and may include fewer than two or more than two gate structures. In such cases, similar effects and results can be also achieved.

Figure 12:
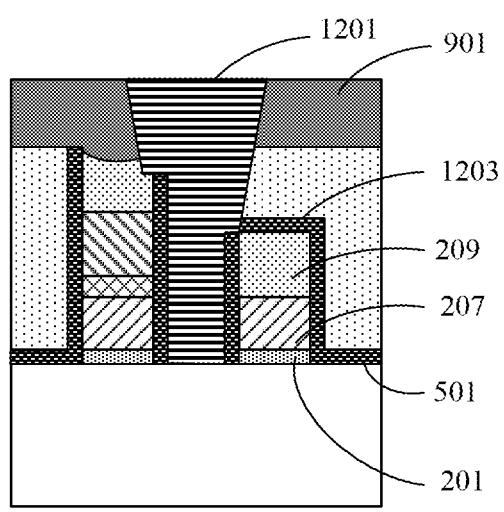
FIG. 12 is a cross-sectional view illustrating a semiconductor device according to another embodiment of the present invention.

FIG. 12 is a cross-sectional view of a semiconductor device according to another embodiment of the present invention. The semiconductor device in FIG. 12 is substantially the same as that in FIG. 11 with the difference that a gate structure 403 of the flash memory device on the right side in FIG. 11 is replaced by a gate structure 1203 for a normal MOS transistor (e.g., a logic device). Gate structure 1203 includes a gate dielectric layer 201 on active region 200, a gate 207 on gate dielectric layer 201, and a hardmask 209 on gate 207. It is to be understood that gate dielectric layer 201, gate 207 and hardmask 209 may be formed the same way and concurrently with the respective gate dielectric layer, the gate layer and the hardmask as shown in FIGS. 4 through 11. Likewise, first dielectric layer 501 is formed on gate structure 1203. As is easily discernible in FIG. 12, gate structure 1203 of the logic device is thinner than gate structure 401 of the memory device (flash memory device), therefore, the risk of the gate being connected (short circuited) to contact 1201 in the corresponding opening on the logic device side is smaller that that in the flash memory device side, so that it is not necessary to give special consideration to the contact on the logic device side. On the flash memory side, it is possible to reduce the risk of the gate being short-circuited to the contact and the risk of the contact being disconnected (i.e., open circuit) from the active region according to embodiments of the present invention. This also applies to cases where there is no gate structure on the right side of the opening.

It will be appreciated that embodiments of the present invention also provide a semiconductor device including a substrate structure. The substrate structure includes a semiconductor substrate having an active region and at least one gate structure on the active region. The gate structure includes a gate dielectric layer on the active layer and a gate on the gate dielectric layer. The gate structure further includes a mask member on the gate. The gate structure also includes a first dielectric layer on sidewalls of the gate structure. The semiconductor device also includes an opening adjacent to the gate structure exposing a surface of the first dielectric layer on the sidewalls of the gate and a portion of the active region adjacent to the gate structure. The mask member has an upper surface including a first recess formed in the middle portion of the upper surface of the mask member.

In one embodiment, the semiconductor device also includes a second recess formed on an upper portion of a portion of the mask member adjacent to the corresponding opening and a portion of the first dielectric layer on a sidewall of the corresponding mask member adjacent to the corresponding opening.

In one embodiment, for each gate structure, the portion of the upper surface of the mask member away from the opening is higher than the remaining portion of the upper surface of the mask member, the portion of the upper surface of the mask member in the vicinity of the opening is lower than the bottom of the first recess in the mask member.

In one embodiment, the at least one gate structure includes two adjacent gate structures. The opening is disposed between and adjacent to the two gate structures. The opening exposes a portion of the first dielectric layer between the two gate structures and a surface of the active region between the two gate structures.

In one embodiment, the mask member is configured such that a ratio of the thickness of the portion at the bottom of the first recess of the mask member to the thickness of the portion of the second dielectric layer at the same level of the bottom of the first recess in the mask member is greater than the etch selectivity ratio of the material of the mask member to the second dielectric layer in the etch process.

In one embodiment, the semiconductor device further includes a contact member filling the exposed surface of the active region in the opening.

In one embodiment, the charge storage portion is a floating gate or a stacked structure of silicon oxide-silicon nitride-silicon oxide. In one embodiment, the intermediate dielectric layer is a stacked structure of silicon oxide-silicon nitride-silicon oxide.

In one embodiment, the semiconductor device includes a flash memory cell that includes the at least one gate structure.

In one embodiment, the hardmask layer is formed of one or more elements selected from the group consisting of silicon oxide, silicon nitride, and metal oxide.

In one embodiment, the active region is a fin-shaped active region.

In one embodiment, the gate portion includes a charge storage portion on the gate dielectric layer, an intermediate dielectric layer on the charge storage portion, and a first gate layer on the intermediate dielectric layer. In one embodiment, charge storage portion is a floating gate or a stacked structure of silicon oxide-silicon nitride-silicon oxide.

In one embodiment, the gate portion includes a gate layer on the gate dielectric layer.

Similarly, according to embodiments of the present invention, the problems associated with the prior art can be mitigated or eliminated, damage to the gate structure(s) can be avoided, undesired short-circuits of the contacts and the gate structures can be prevented, and reliability and yield of the semiconductor device are improved. The device profile is improved during the fabrication process and open circuit of the contact with the active area can be avoided.

An embodiment of the present invention will now be described in detail with reference to FIGS. 13 through 23.

Figure 13:
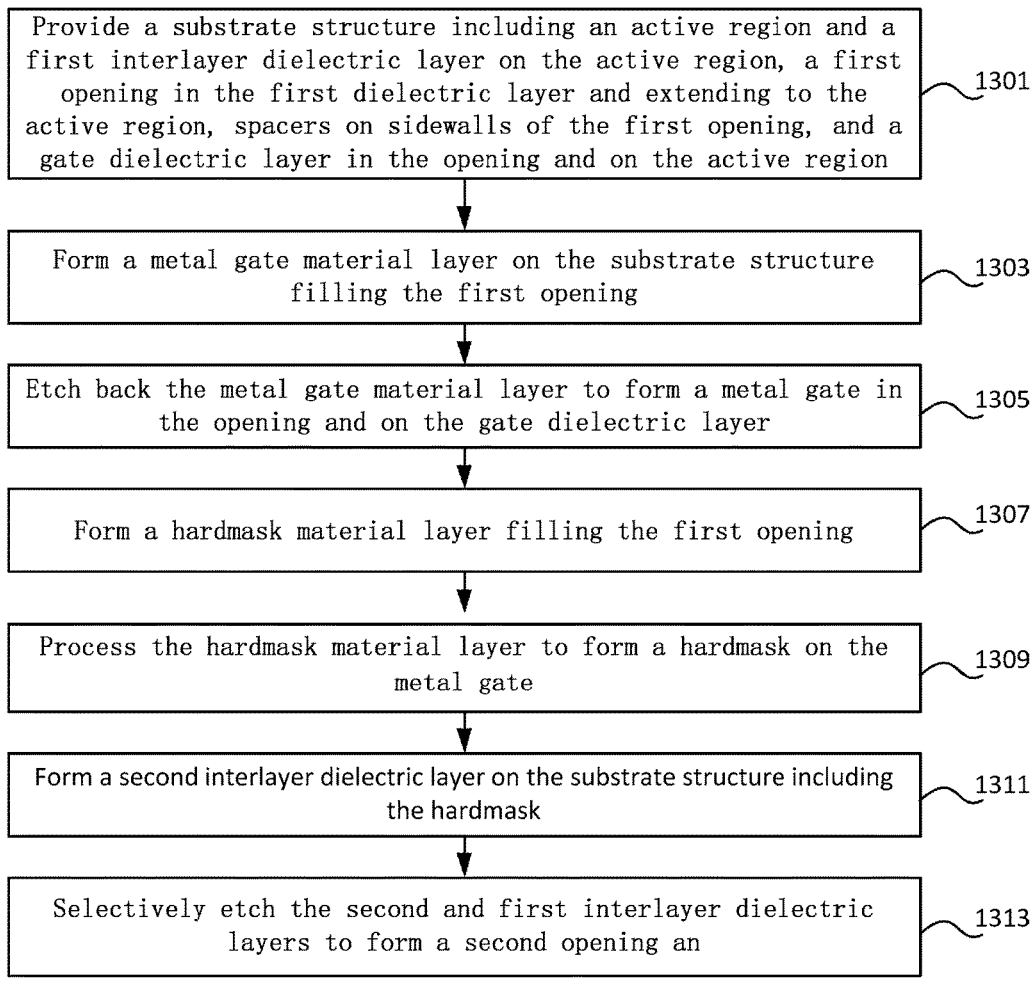
FIG. 13 is a simplified flowchart illustrating some of the main steps in a method for manufacturing a semiconductor device according to one embodiment of the present invention.

FIG. 13 is a simplified flowchart illustrating some of the main steps in a method for manufacturing a semiconductor device according to another embodiment of the present invention. FIGS. 14 through 23 are cross-sectional views illustrating intermediate stages of a semiconductor device in some of the main steps in a manufacturing method according to one embodiment of the present invention.

Referring to FIG. 13, at 1301, a substrate structure is provided. The substrate structure may include an active region, a first interlayer dielectric layer on the active region, and at least one first opening in the first interlayer dielectric layer and extending into the active region. The substrate structure may also include spacers on sidewalls of the first opening and a gate dielectric layer in the first opening and on the active region.

Figure 14:
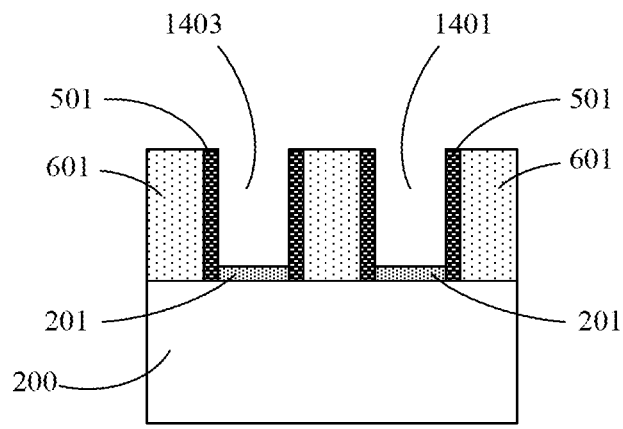
FIGS. 14 through 23 are cross-sectional views illustrating intermediate stages of a semiconductor device in some of the main steps in a manufacturing method according to one embodiment of the present invention.

Referring to FIG. 14, the substrate structure may include an active region 200, a first interlayer dielectric layer 601 on active region 200, at least one first opening 1401/1403 in first interlayer dielectric layer 601 extending to active region 200. The substrate structure may further include spacers 501 on sidewalls of at least one first opening 1401/1403 and a gate dielectric layer 201 in the first opening and on the active region. In some embodiments, at least one first opening 1401/1403 includes two adjacent and separate openings 1401 and 1403.

It is understood by those of skill in the art that these layers may be formed using processes known in the art or developed in the future, and details of processes of forming such layers will not be described herein. Further, it is understood that substrate structure 200 is not particularly limited, as long it includes a semiconductor layer that has an active region. For example, the semiconductor layer may be a bulk silicon substrate, a semiconductor on insulator (SOI), and the like. In other words, reference numeral 200 may also be used to indicate a semiconductor substrate. In some embodiments, the active region may be in the form of a fin.

Figure 15:
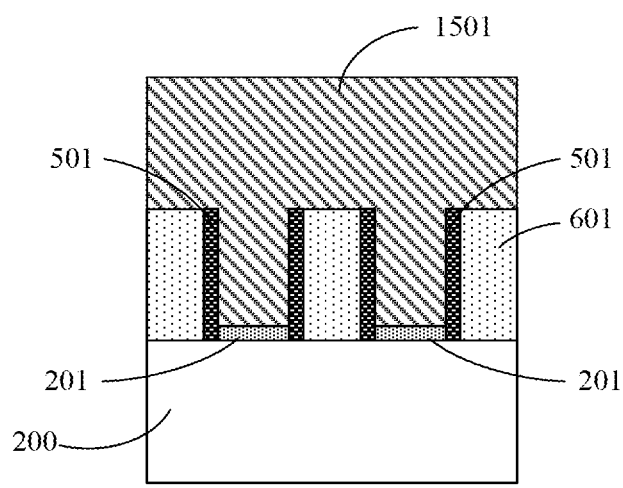

Next, at 1303, as shown in FIG. 15, a metal gate material layer 1501 is formed on the substrate structure filling at least one first opening 1401/1403. In some embodiments, metal gate material layer 1501 may be formed using a sputtering or deposition (e.g., chemical vapor deposition) process. The metal gate material layer may be formed of a metal such as tungsten. The metal gate material layer may also include other functional layers, e.g., an adhesion layer, a barrier layer, and/or a work function adjustment layer, etc.

Figure 16:
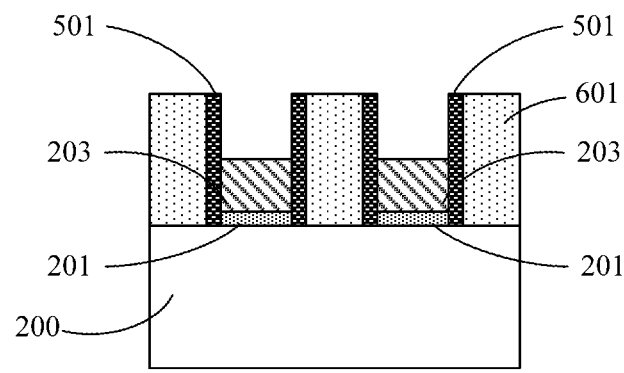

Next, at 1305, as shown in FIG. 16, metal gate material layer 1501 is etched back to form a metal gate 203 in at least one first opening 1401/1403 and on gate dielectric layer 201.

Figure 17:
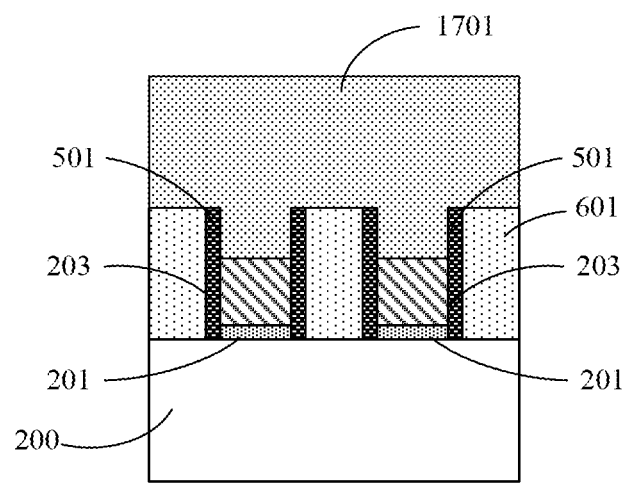

Next, at 1307, as shown in FIG. 17, after forming the metal gate, a hardmask material layer 1701 is formed filling the at least one first opening. In one example embodiment, the hardmask material layer may be formed of silicon nitride. In some embodiments, the spacers may have the same material as that of the hardmask layer.

Thereafter, at 1309, hardmask material layer 1701 is submitted to a process to form a hardmask 701 on the metal gate. Hardmask 701 is formed having a first recess 801 in the middle portion of its upper surface. Thus, a gate structure is formed in the first opening, the gate structure includes gate dielectric layer 201, metal gate 203, hardmask 701, and spacers 501 on sidewalls of the first opening.

Figure 18:
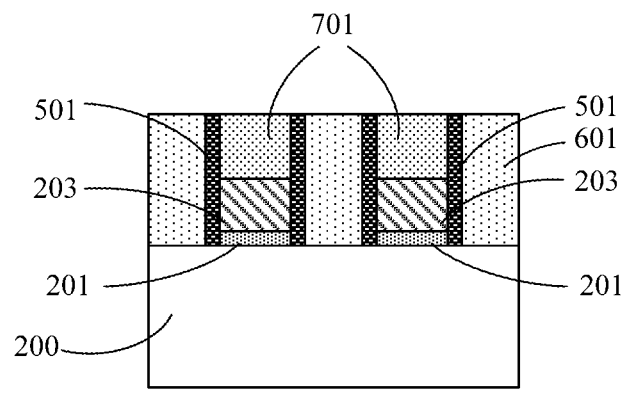

In one embodiment, the method may include, as shown in FIG. 18, after forming hardmask material layer 1701, a planarization process to expose the upper surface of first interlayer dielectric layer 601. The planarization causes the upper surface of first interlayer dielectric layer 601 to be flush with the upper surface of the remaining portion of the hardmask material layer (hardmask 701). Next, the upper surface of hardmask 701 is etched back to form a first recess 801 which is in the middle portion of the upper surface of the hardmask 701. In one exemplary embodiment, the hardmask may be processed by plasma etching using a fluorine-containing process gas, including but not limited to, one or more of $CHF_3$, $CH_2F_2$, $CH_3F$ to form the first recess.

Figure 19:
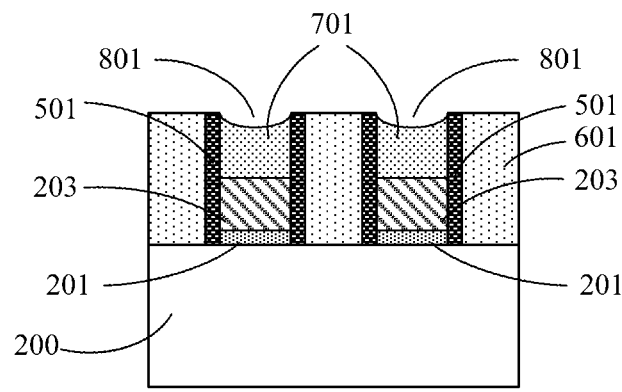

In another embodiment, the method may include, after forming hardmask material layer 1701, performing an over polish on the hardmask layer using a chemical mechanical polishing (CMP) process so that, after the recess (surface) treatment, the upper surface of the remaining portion of the hardmask material layer (hardmask 701) is flush with the upper surface of interlayer dielectric layer 601 and has first recess 801 in the middle portion of the upper surface of hardmask 701, as shown in FIG. 19.

It is to be understood that the first recess shown in FIG. 19 is merely exemplary and that embodiments of the present invention are not limited to the example shown in the figures.

Figure 20:
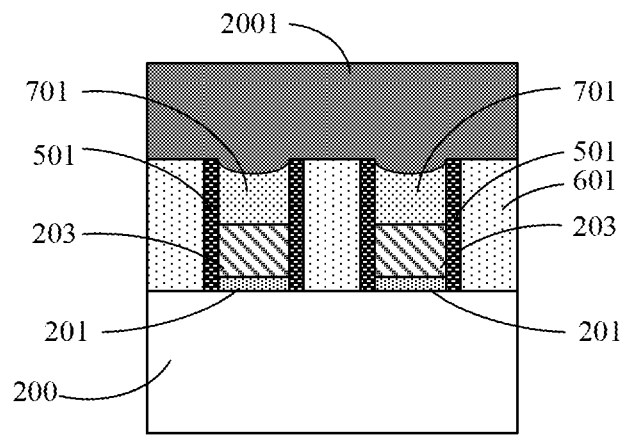

Next, at 1311, as shown in FIG. 20, a second interlayer dielectric layer 2001 is formed on the substrate structure that includes the formed hardmask. In some embodiments, second interlayer dielectric layer 2001 may be formed of a spin-coated dielectric layer using a spin coating process. In other embodiments, second interlayer dielectric layer 2001 may be formed of a silicon oxide using a conventional chemical vapor deposition (CVD) process.

Figure 21:
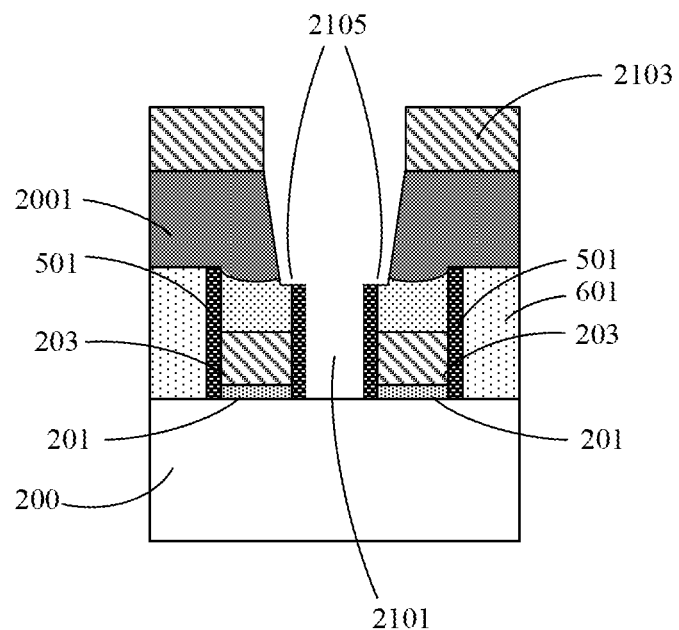

Next, at 1313, as shown in FIG. 21, a selective etching process is performed on second interlayer dielectric layer 2001 and first interlayer dielectric layer 601, at least on spacers 501, and preferably on spacers 501 and hardmask 701 to form a second opening 2101 adjacent to the at least one gate structure. Second opening 2101 exposes spacers 501 of the adjacent gate structures and a surface of the active region between the adjacent gate structures.

In embodiments where the at least one first opening includes two adjacent first openings (thus including two adjacent corresponding gate structures), the formed second opening is second opening 2101 between and adjacent to the two gate structures formed in corresponding two first openings 1401 and 1403. Second opening 2101 exposes spacers 501 of the two gate structures adjacent to the second opening, and second opening 2101 exposes the surface of the active region between the spacers of the two gate structures adjacent to the second opening.

In some embodiments, the etching process may be performed using a patterned mask (e.g., photoresist) 2103. For example, a functional layer for lithography, such as but not limited to, a bottom anti-reflective coating (BARC), amorphous carbon (AC), and/or dielectric anti-reflective coating (DARC) may be formed on the structure shown in FIG. 20, followed by formation of a photoresist on the functional layer and patterning (e.g., exposure and development). The present invention is not limited thereto. For example, patterned mask 2103 may be formed by a dry or wet scanning, nano-printing, or self-assembly process. In some embodiments, the feature size (e.g., the lateral dimension) used to form the respective openings in the patterned mask (e.g., openings in the patterned mask) is greater than a corresponding size of the corresponding second opening 2101. After etching second interlayer layer 2001 and first interlayer layer 601, the patterned mask and the functional layer can be removed.

Herein, a dry plasma etching based on a fluorocarbon gas ($C_xF_y$, where x and y are positive numbers) may be used and is configured such, that the etch ratio of the second and first interlayer dielectric layers to the hardmask and/or the spacers (i.e., the ratio of the etch rate of the second and first interlayer dielectric layers to the etch rate of the hardmask and/or spacers) is greater than 1, preferably greater than 1, preferably greater than 1 and less than or equal to 10, more preferably between 3 and 10, and more preferably between 5 and 10.

The etching process also causes a removal of a portion of the hardmask of the gate structures and a portion of the upper portion of the spacers on the sidewalls of the hardmask adjacent the second opening to form a second recess 2105.

In some embodiments, referring to FIG. 21, the etching process causes the portion of the upper surface of hardmask 701 which is farther away from the second opening to be higher than the remaining portion of the upper surface of hardmask 701, and the portion of the upper surface of hardmask 701 in the vicinity of the second opening is lower than the bottom of the first recess in the hardmask.

Herein, preferably, after the etching process, the ratio of the thickness of the portion at the bottom of the first recess in the hardmask to the thickness of the first interlayer dielectric layer at the same level as the bottom of the first recess in the hardmask is greater than the etch selectivity ratio of the material of the hardmask to the material of the first interlayer dielectric layer in the etching process. One of skill in the art will appreciate that the above configuration is not essential to the present invention and that different embodiments may not require such an arrangement depending on the materials employed, the size of the mask opening, the thickness of each material layer.

In accordance with the present invention, hardmask 701 and spacers 501 remain in a relatively good profile shape to cover first gate 207.

Figure 22:
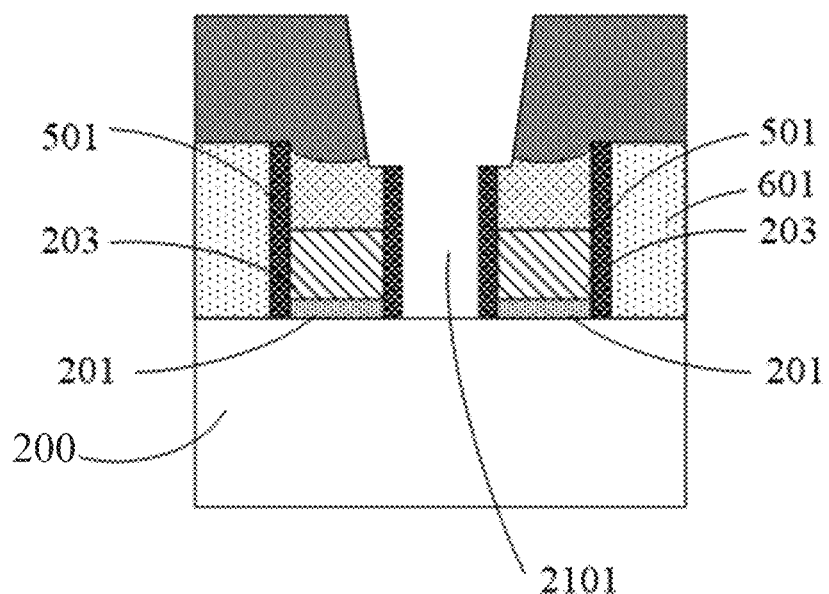
Figure 23:
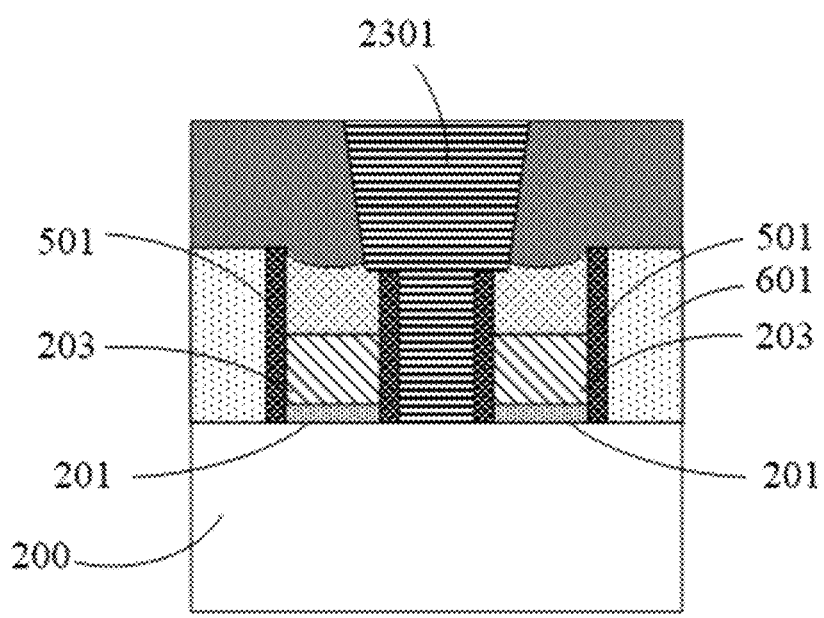

Next, referring to FIG. 22, a contact 2301 may be formed on the exposed surface of the active region. Contact 2301 may be formed using materials and processes known in the art or developed in the future, so that the formation of the contact will not be described in detail herein.

In some embodiments, the active region may be a fin-shaped active region. In this case, FIGS. 14 to 23 are cross-sectional views illustrating the intermediate stages of the semiconductor device along the longitudinal direction of the fin.

According to embodiments of the present invention, at least the prior art problems can be mitigated or eliminated, damage to the gate structure can be prevented, undesired short-circuit between the contact and the gate structure can be avoided, thereby improving the profile of the device and/or preventing open circuit of the contact with the active region, and improving the device yield and reliability.

Embodiments of the present invention also provide a semiconductor device comprising a substrate structure. The substrate structure includes an active region and a first interlayer dielectric layer on the active region, a first opening in the first interlayer dielectric layer and extending to the active region.

The semiconductor device also includes a gate structure in the first opening. The gate structure includes spacers on opposite sidewalls of the first opening. The gate structure also includes a gate dielectric layer on the active region, a metal gate on the gate dielectric layer, and a hardmask on the metal gate, all of which are disposed between the spacers. The hardmask has a first recess in the middle portion of its upper surface.

The semiconductor device also includes a second opening adjacent to the gate structure in the first opening, the second opening exposes spacers of the first opening and a surface of the active region adjacent to the gate structure.

In one embodiment, a second recess is formed on a portion of the hardmask of the gate structure adjacent to the second opening and a portion of the spacers on the sidewalls of the hardmask adjacent to the first opening.

In one embodiment, the portion of the upper surface of the hardmask away from the openings (first and second openings) is higher than the remaining portion of the upper surface of the hardmask, and the portion of the upper surface of the hardmask in the vicinity of the openings is lower than the bottom of the first recess of the hardmask.

In one embodiment, the first opening includes two adjacent openings each having a gate structure formed therein. The second opening is disposed between the two openings and adjacent to the two gate structures. The second opening exposes the spacers adjacent to the two gate structures and a surface of the active region between the spacers that are adjacent to the two gate structures.

In one embodiment, the hardmask is configured such that the ratio of the thickness of the portion at the bottom of the first recess in the hardmask to the thickness of the first interlayer dielectric layer at the same level of the bottom of the first recess in the hardmask is greater than the etch selectivity ratio of the material of the hardmask to the material of the first interlayer dielectric layer.

In one embodiment, the semiconductor device further includes a contact member filling the second opening and in physical contact with the exposed surface of the active region.

In one embodiment, the hardmask is formed of one or more elements selected from the group consisting of silicon oxide, silicon nitride, and metal oxide. In one embodiment, the spacers include a same material as that of the hardmask.

In one embodiment, the active region is a fin-shaped active region.

Similarly, according to embodiments of the present invention, the problems associated with the prior art can be mitigated or eliminated, damage to the gate structure can be avoided, undesired short-circuits of the contact and the gate structures can be prevented, and reliability and yield of the semiconductor device are improved. The device profile is improved during the fabrication process and open circuit of the contact with the active area can be avoided.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method for manufacturing a semiconductor device, comprising:

providing a substrate structure including a semiconductor substrate having an active region, at least one gate structure on the active region and including a gate dielectric layer on the active region, a gate portion on the gate dielectric layer, and a hardmask on the gate portion;

forming a first dielectric layer on the at least one gate structure and a surface of the active region adjacent to the at least one gate structure, wherein a portion of the first dielectric layer on the hardmask and the hardmask form a mask member;

forming a second dielectric layer on the first dielectric layer covering the at least one gate structure;

performing a surface treatment on the second dielectric layer so that an upper surface of the second dielectric layer is flush with an upper surface of the mask member and a first recess is formed in a middle portion of the upper surface of the mask member;

forming a third dielectric layer on the second dielectric layer covering the mask member; and selectively etching the third dielectric layer and the second dielectric layer relative to the first dielectric layer and the mask member to form an opening adjacent to the at least one gate structure, the opening exposing a portion of the first dielectric layer on sidewalls of the at least one gate structure and a portion of the first dielectric layer on the active region adjacent to the at least one gate structure.

2. The method of claim 1, wherein the selectively etching further etches an upper portion of the mask member and a portion of the first dielectric layer on the sidewalls of the mask member adjacent to the opening to form a second recess.

3. The method of claim 1, wherein the selectively etching causes a portion of the upper surface of the mask member away from the opening to be higher than a remaining portion of the mask member, and a portion of the upper surface of the mask member in a vicinity of the opening to be lower than a bottom of the first recess of the mask member.

4. The method of claim 1, wherein the mask member is configured such that, after performing the surface treatment, a ratio of a thickness of a bottom of the first recess in the mask member to a thickness of the second dielectric layer at a same level as the bottom of the first recess is greater than an etch selectivity ratio of a material of the mask member to a material of the second dielectric layer.

5. The method of claim 1, wherein:
the at least one gate structure comprises two adjacent gate structures, the first dielectric layer being formed to cover the two adjacent gate structures and a surface of the active region between the two adjacent gate structures;
forming the second dielectric layer comprises filling an air gap between the two adjacent gate structures;
the opening is disposed between the two adjacent gate structures exposing a portion of the first dielectric layer on the active region between the two adjacent gate structures.

6. The method of claim 1, wherein providing the substrate structure comprises:
forming the gate dielectric layer on the semiconductor substrate;
forming a charge storage layer on the gate dielectric layer;
forming an intermediate dielectric layer on the charge storage layer;
forming a first gate layer on the intermediate dielectric layer;

forming a hardmask layer on the first gate layer; and
etching the hardmask layer, the first gate layer, the intermediate dielectric layer, the charge storage layer, and the gate dielectric layer to form the at least one gate structure,
wherein the gate portion comprises a charge storage portion on the gate dielectric layer, the intermediate dielectric layer on the charge storage portion, and the first gate layer on the intermediate dielectric layer.

7. The method of claim 1, wherein providing the substrate structure comprises:
forming the gate dielectric layer on the semiconductor substrate;
forming a second gate layer on the gate dielectric layer;
forming a hardmask layer on the second gate layer;
etching the hardmask layer, the second gate layer, and the gate dielectric layer to form the at least one gate structure,
wherein the gate portion comprises the second gate layer on the gate dielectric layer.

8. The method of claim 1, wherein performing the surface treatment comprises:
planarizing the second dielectric layer to expose the upper surface of the mask member; and
etching back the exposed upper surface to form the first recess.

9. The method of claim 1, wherein performing the surface treatment comprises:
performing an over polish on the second dielectric layer using a chemical mechanical polishing process.

10. The method of claim 1, wherein selectively etching the third dielectric layer and the second dielectric layer comprises:
performing a dry or wet scanning, nano-printing, or self-assembly process using a patterned mask.

11. The method of claim 1, wherein selectively etching the third dielectric layer and the second dielectric layer comprises:
performing a dry plasma etching based on a fluorocarbon gas CxFy, x and y being positive numbers, wherein an etch ratio of the third and second dielectric layers to the hardmask and/or the first dielectric layer is greater than 1 and less than or equal to 10.

12. The method of claim 1, further comprising:
removing a portion of the exposed portion of the first dielectric layer on the active region to expose a surface of the active region; and
forming a contact member extending to the exposed surface of the active region.

13. The method of claim 1, wherein the first dielectric layer and the hardmask comprise a same material.

14. The method of claim 1, wherein the semiconductor device comprises a flash memory cell including the at least one gate structure.

15. The method of claim 1, wherein the active region is a fin-shaped active region.

16. The method of claim 6, wherein the charge storage portion is a floating gate or a silicon oxide silicon nitride silicon oxide stacked structure.

17. A semiconductor device, comprising:
a substrate structure comprising:
a semiconductor substrate including an active region;
at least one gate structure on the active region and comprising a gate dielectric layer on the active region, a gate portion on the gate dielectric layer, and a mask layer on the gate portion; and a first dielectric layer on a side surface of the gate dielectric layer, on a side surface of the gate portion, and on a side surface of the mask layer, wherein the mask layer and a portion of the first dielectric layer on the side surface of the mask layer form a mask member; and an opening adjacent to the at least one gate structure and exposing the first dielectric layer and a surface portion of the active region adjacent to the at least one gate structure, wherein the mask member comprises a first recess in a middle portion of its upper surface.

18. The semiconductor device of claim 17, further comprising a second recess formed on a portion of an upper portion of the mask member adjacent to the opening and a portion of an upper portion of the first dielectric layer on the sidewalls of the mask member adjacent to the opening.

19. The semiconductor device of claim 17, wherein a portion of an upper surface of the mask member away from the opening is higher than a remaining portion of the upper surface of the mask member, and a portion of the upper surface of the mask member in a vicinity of the opening is lower than a bottom in the middle portion of the first recess.

20. The semiconductor device of claim 17, wherein the mask member is configured such that a ratio of a thickness of a portion of the upper surface of the mask member at a bottom of the first recess to a thickness of a portion of a second dielectric layer at a same level of the upper surface of the mask member is greater than an etch selectivity ratio of a material of the mask member to a material of the second dielectric layer.

* * * * *